AUTOMATIC GAIN CONTROL AMPLIFIER

Filed Oct. 9, 1963 2 Sheets-Sheet 1

INVENTOR:
NICHOLAS J. HUDAK
BY Richard V. Lang
HIS ATTORNEY.

INVENTOR:
NICHOLAS J. HUDAK
BY Richard V. Lang
HIS ATTORNEY.

United States Patent Office 3,333,208

Patented July 25, 1967

3,333,208
AUTOMATIC GAIN CONTROL AMPLIFIER

Nicholas J. Hudak, Liverpool, N.Y., assignor to General Electric Company, a corporation of New York Filed Oct. 9, 1963, Ser. No. 315,077
6 Claims. (Cl. 330—59)

The present invention relates to amplifier circuitry and, more specifically, to automatic gain control amplifiers.

Automatic gain control amplifiers have been available for providing automatic control of program channel levels in broadcasting studios. Such amplifiers provide both volume compression and volume expansion. Volume compression refers to the automatic reduction of gain of the amplifier in order to provide a normal output when a greater than normal signal, i.e., one exceeding a selected upper threshold, is applied to the input. Such automatic gain control is generally required in order to achieve the proper amount of signal compression to adapt the usual high dynamic range of program material to the more limited dynamic range of the customary program translating channels such as radio transmitters or recording devices.

Volume expansion refers to the non-linear increase in output level which is arranged to occur as the signal level increases through a range of low levels, usually well below normal signal level, and attains the threshold at the bottom of the normal signal volume range. As the signal level decreases, volume expansion sharply reduces the output level when the signal volume falls below the selected lower threshold. In a static situation, the effect of the expansion circuit is to reduce the actual output noise level and may also be referred to as a volume reduction circuit.

In a dynamic situation where the program material contains frequent pauses, the effect of the compression circuitry is to cause increases in gain of the amplifier during these pauses, and thus to increase the background noise level. The volume expansion circuitry in such cases has an effect opposite to that of the compression circuitry. It is herein proposed that this effect be used to achieve suitable reductions in gain during these pauses with the object of stabilizing the noise level during the pauses.

Accordingly, an object of the present invention is to provide an improved automatic gain control amplifier.

Another object of the present invention is to provide improved automatic gain control circuitry employing both volume expansion and volume compression.

A further object of the present invention is to provide automatic gain control circuitry wherein the recovery times of the volume expansion and volume compression circuitry are proportioned to stabilize the noise level during pauses in the program material.

Prior art automatic gain control amplifiers have generally featured the feeding back of a rectified portion of the output signal as a DC control voltage to control the gain of a variable m$\mu$ vacuum tube. Comparable transistorized gain control amplifiers have not been available since a semiconductor element corresponding to the variable m$\mu$ tube is not yet generally available. It is a further object of the present invention to provide volume compression and volume expansion circuitry which is compatible with transistorized amplifier circuitry.

These and other objects are achieved in one embodiment of the invention by the provision of first and second light dependent resistances connected in shunt with the input of a stage of an automatic gain controlled amplifier. Volume compression circuitry responsive to the output signal of the amplifier serves to control the intensity of a light illuminating the first light dependent resistance in a manner to achieve compression of the output signal when a selected compression threshold is exceeded.

Volume expansion circuitry also responsive to the output of the signal amplifier serves to control the intensity of a light illuminating the second light dependent resistance in a manner to achieve expansion of the output signal when the output signal falls below a selected expansion threshold. The effect of illumination on either shunt connected light dependent resistance, is to achieve a gain reduction of the amplifier. In a preferred arrangement, the timing of the recovery rates of the respective A.G.C. circuits is adjusted so that, when short pauses occur, the gain is stabilized to the point where the noise background does not noticeably increase. The attack times of the respective circuits is rapid, and in terms of listener perception, substantially instantaneous.

The novel and distinctive features of the invention are set forth in the appended claims. The invention itself, together with further objects and advantages thereof, may be best understood by reference to the following description and accompanying drawings in which:

FIGURE 1 is a block diagram of one embodiment of a transistorized automatic gain control amplifier in accordance with the present invention. The shunt resistance in the class of semiconductors such as CdSe CdS, and the like.

Figure 1:
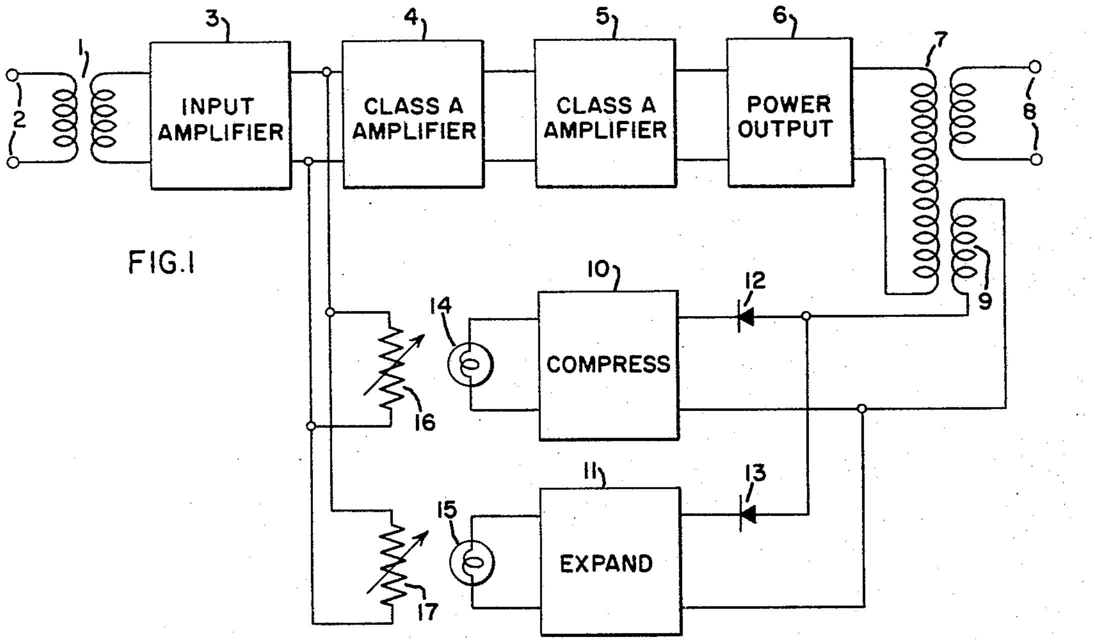

Referring to FIGURE 1, there is shown in block diagram form an embodiment of the automatic gain control amplifier of the present invention wherein variable resistances inserted in an interstage coupling network are employed to achieve volume compression and volume expansion. An input transformer 1 couples an audio signal applied to input terminals 2 to an input amplifying stage 3. The audio signal is then applied in an amplifier which may take the form of a first class A amplifier 4, second class A amplifier 5, and a power output stage 6. An output transformer 7, connected to the power output stage 6, is used to apply the amplified audio signal to the output terminals 8.

A portion of the output is coupled from transformer 7 through a tertiary or feedback winding 9, through rectifying diodes 12 and 13, respectively, to parallel connected compression stage 10 and expansion stage 11. The compression stage 10 is a DC amplifier not requiring substantial voltage gain but having substantial power gain. The expansion stage 11 is also a DC amplifier, requiring both voltage and power gain. A light source 14, for example an incandescent lamp, is connected across the output of the compression stage 10, a similar light source 15 being connected across the output of expansion stage 11. Light from the source 14 is optically coupled to a light dependent resistance 16, the value of which is decreased with the intensity of light impingent thereon. In a similar manner light emitted by source 15 is optically coupled to a similar light dependent resistance 17. The light dependent resistances 16 and 17 are both connected in shunt with the signal path between the input amplifier stage 3 and the class A amplifier stage 4 to control the gain of the overall amplifier.

In the operation of the circuit of FIGURE 1 an audio input signal applied to the terminal 2, is successively amplified by the stages 3, 4, 5, and 6, to develop an amplified audio output across the output terminals 8. A portion of the amplified output is fed back through feedback winding 9 to compression stage 10 and expansion stage 11, the feedback signal having been previously rectified by diodes 12 and 13 respectively. When the output voltage rises above a selected compression threshold as will be more fully explained hereinafter, the DC feedback voltage applied to the compression circuit 10 is amplified, and amplified to a sufficient power level to energize light source 14. Once illuminated, the intensity of the light increases with increasing output voltage from stage 6. The light emitted by light source 14 impinges upon light dependent resistance 16 so that as the intensity of the lamp increases the value of resistance of light dependent resistance 16 will decrease. As the value of light dependent resistance 16 decreases, a larger portion of the signal coupled from the output of stage 3 to the input of stage 4 will be shunted to ground and a smaller portion will be coupled to the succeeding stage 4. Thereby the gain of the amplifier is decreased to provide compression to the dynamic excursion of the signal when it exceeds the compression threshold.

A portion of the output signal is also rectified and applied to the expansion circuit 11. In the absence of a signal, the feedback signal applied to expansion circuit 11 will fall below a prescribed threshold level. As will be more fully explained hereinafter, as this expansion threshold is crossed by a decreasing signal, the expansion circuit will cause the light source 15 to be energized. Light from the light source 15 impinges upon the light dependent resistance 17, decreasing its value. Since the light dependent resistance 17 is connected in shunt between stages 3 and 4 of the amplifier in a similar manner to light dependent resistance 16, a reduction in value of light dependent resistance 17 will shunt a portion of the signal to ground, thereby reducing the portion of the signal coupled to the succeeding stage, and thus the gain of the overall amplifier.

As will be fully explained below, the expansion circuit operates from the lower limit of linear operation of the amplifier, which is termed the "expansion threshold" to a lower limit well down into the lower auditory limits. Under static conditions, the expansion circuitry causes the output of the amplifier to change in a substantially step function with a small change in input level. As will be explained hereinafter, the number of decibels of the step in output level is adjustable, and is usually set to be in excess of 10 db.

Figure 2:
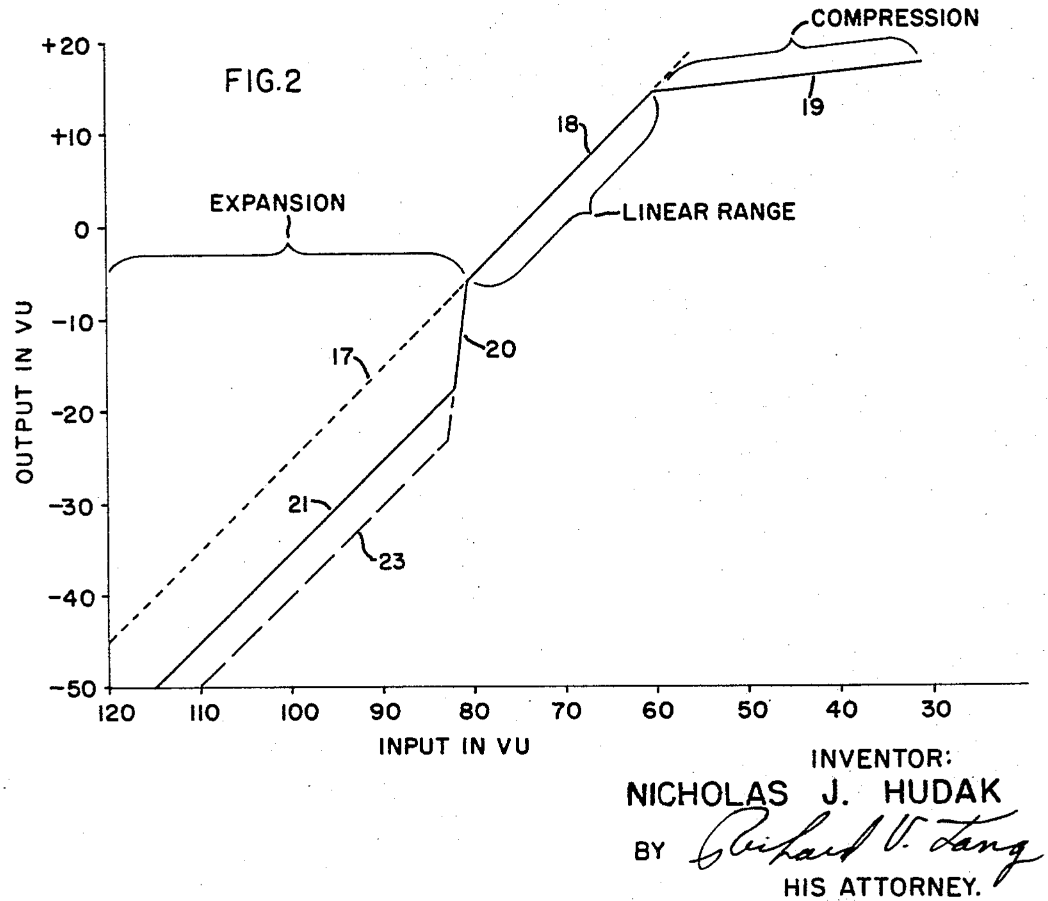
FIGURE 2 is a graphical representation of the static operating characteristics of the automatic gain control amplifier of the present invention.

Referring now to FIGURE 2, there is shown a graphical representation of the static operating characteristics of the amplifier of the present invention wherein output in volume units is plotted against input in volume units. The term volume units is used in the conventional sense, and implies the power contained in a complex waveform and is logarithmically scaled analogously to decibels. Dotted line 17 represents the operating characteristic of the instant amplifier in the absence of compression and expansion circuitry. The unbroken line represented by line segments 18, 19, 20 and 21, represents the operating characteristic of the instant amplifier when the compression and expansion circuits are utilized under static conditions. It will be seen that the line segment 18 represents the normal operation of the amplifier when the output is neither above the prescribed compression threshold level to cause the compression circuitry to operate nor below the prescribed expansion threshold level to cause the expansion circuitry to operate. When the output reaches the prescribed compression threshold level, the compression circuit causes the operating characteristic to deviate from the normal operation as represented by line segment 18 to reduced gain operation as indicated by line segment 19.

In the absence of a signal, when the output voltage falls below the prescribed expansion threshold level, operation of the expansion circuitry causes the operating characteristic to deviate from the normal operation indicated by line segment 18 to the reduced output level operation indicated by line segment 21, line segment 20 indicating an almost step-like transition from normal output level operation to reduced output level operation.

From the graph of FIGURE 2, it is seen that the threshold of compression and threshold of expansion have been chosen to provide an arbitrary range of linear operation, in this case 20 db, as represented by line segment 18. The range of linear operation of the amplifier is thus controlled by the thresholds at which the compression circuitry and expansion circuitry become operable.

The above plot in FIGURE 2 is representative of the relationship between input level and output level under static conditions. It may be seen that the expansion circuit will be in operation through a given range of input levels and the compression circuit will be in operation through a second range of input levels. Under static conditions there is no interaction between the two. However, considering dynamic operation, when the signal suddenly increases in level from below the expansion threshold to the compression threshold, there is no appreciable interaction since both circuits are designed to have a fast attact time. In the reverse direction, as when the signal suddenly falls from above the compression level to below the expansion threshold, then both circuits may interact. As the compression circuit tends to recover from the effect of a high level signal, it will tend to increase the gain and thus increases the noise level, while the expansion circuit tends to reduce the gain and thereby reduces the noise level. The relative rates of recovery of the two respective circuits are selected in accordance with the invention, to substantially overlap and are selected to prevent an appreciable increase of noise in this transition (e.g., from large signal to small signal levels) as will be more fully explained hereinafter.

Figure 3:
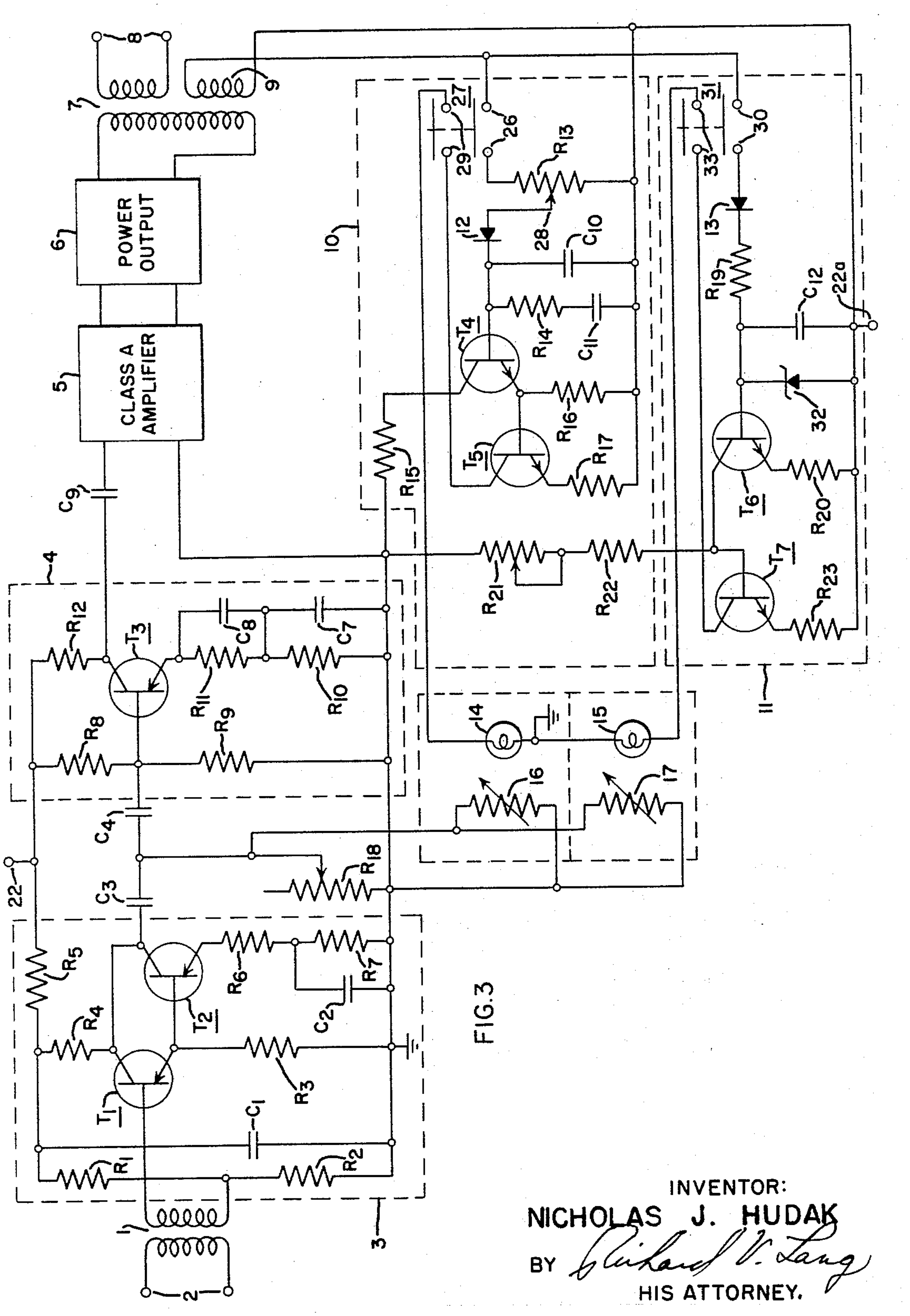
FIGURE 3 depicts, a circuit diagram of the automatic gain control amplifier of FIGURE 1.

Referring to FIGURE 3 there is shown a circuit diagram of the automatic gain control amplifier of FIGURE 1, whose operation has been explained with reference to FIGURE 2, similar reference numerals being given to like elements in the respective figures. An audio input signal applied to terminals 2 is coupled through transformer 1 to the input amplifier stage 3 comprising transistors $T_1$ and $T_2$, the input signal being applied to the base of the transitor $T_1$. The resistances $R_1$ and $R_2$ form a voltage divider the intermediate point of which is connected through the second arm of transformer 1 to the base of the transistor $T_1$. This divider in conjunction with the resistance $R_3$ connected to the emitter of $T_1$ serves to bias the transistor $T_1$ into class A operation in a conventional manner. Load resistance $R_4$ is connected to the collector of the transistor $T_1$ and to a suitable positive DC voltage supply connected to terminal 22, through a decoupling resistance $R_5$. The collector of the transistor $T_1$ is connected to the collector of a transistor $T_2$, the emitter of transistor $T_1$ being connected to the base of the transistor $T_2$. Thus, the transistors $T_1$ and $T_2$ are connected in the familiar Darlington compound connection. Serially connected resistances $R_6$ and $R_7$ are connected between the emitter of transistor $T_2$ and ground to establish the proper operating point of transistor $T_2$, resistance $R_7$ being bypassed by a capacitor $C_2$, and at the same time producing a degree of degeneration in the unbypassed $R_6$ for elevation of the amplifier input impedance.

The output of the Darlington compound connection, comprised of transistors $T_1$ and $T_2$, is taken from the common collector of these two transistors and is connected through a pair of serially connected coupling capacitors $C_3$ and $C_4$ to the class A amplifier stage 4 comprising a transistor $T_3$. This last mentioned connection is made to the base of the transistor $T_3$. Transistor $T_3$ is provided with resistances $R_8$ and $R_9$ which form a voltage divider, the intermediate point of which is connected to the base of the transistor $T_3$ and which in conjunction with resistances $R_{10}$ and $R_{11}$ serially connected between the emitter of transistor $T_3$ and ground, provide the proper bias to insure class A operation of the transistor $T_3$. A load resistance $R_{12}$ is connected between the collector of the transistor $T_3$ and said positive supply terminal 22. The resistances $R_{10}$ and $R_{11}$ are respectively bypassed by capacitors $C_7$ and $C_8$, selected to enhance high frequency response.

The output of transistor $T_3$ is coupled through coupling capacitor $C_9$ from the collector of transistor $T_3$ to class A amplifier 5, the output of class A amplifier 5 being connected to the power output stage 6. An output transformer 7 is connected to the power output stage 6, the transformer 7 being provided with a first secondary 7 connected to the output terminals 8. A tertiary or feedback winding 9 is utilized to feed back a portion of the output signal to the compression and expansion circuitry.

The tertiary winding 9 is connected to the compression circuit 10 which comprises transistors $T_4$ and $T_5$. The tertiary winding 9 has one terminal connected through a first pair of contacts 26 of a double pole single throw switch 27 to a compression threshold adjusting potentiometer $R_{13}$. The other terminal of tertiary winding 9 is connected to a point of negative DC potential at AC ground which the remote terminal of $R_{13}$ is also returned. The movable tap 28 of potentiometer $R_{13}$ is connected through diode 12 to the base of a transistor $T_4$, which is biased off when the output voltage is below the prescribed threshold level, the diode 12 serving to rectify the feedback signal appearing across the secondary 9. Capacitor $C_{10}$ and serially connected resistance $R_{14}$ and capacitor $C_{11}$ are connected in shunt in the base emitter circuit of the transistor $T_4$, the capacitors $C_{10}$ and $C_{11}$ serving to provide a long recovery time, i.e. when passing from high signal level to normal signal level. The time constant of this circuit is on the order of several seconds and is selected to avoid a phenomenon referred to as "pumping" which is a wavering in the volume level, particularly noticeable in the transmission of music program material.

The foregoing components $C_{10}$ and $C_{11}$ and $R_{14}$ have no corresponding slowing down effect upon the attack time of the compression circuit. This is because the diode 12, and the input junction of the transistor $T_4$ are poled for easy conduction upon the application of increasing feedback voltages from the feedback winding 9. Thus they exhibit a low impedance, which reduces the effect of the shunting impedances. The compression circuit thus has a relatively fast attack time, selected to be fast enough to escape detection by the average listener and may be a few milliseconds.

A voltage dropping resistance $R_{15}$ is connected to the collector of the transistor $T_4$, the load resistance $R_{16}$ being connected to the emitter of the transistor $T_4$ for emitter follower operation. The emitter of the transistor $T_4$ is connected to the base of a transistor $T_5$ which is biased off when the transistor $T_4$ is not conducting. The collector of the transistor $T_5$ is connected through a second pair of contacts 29 of double pole single throw switch 27 to light source 14, the transistor $T_5$, when conducting, serving to energize light source 14. A resistance $R_{17}$ is connected to the emitter of the transistor $T_5$ to define the operating point thereof. Light from the light source 14 impinges upon the light dependent resistance 16 as previously discussed to control the value of this latter resistance. The light dependent resistance 16 is connected in shunt with an interstage gain control potentiometer $K_{18}$ connected between the junction between capacitors $C_3$ and $C_4$ and ground to thereby control the overall amplifier gain as previously explained.

The tertiary winding 9 is also connected through a first pair of contacts 30 of double pole single throw switch 31 to the volume expansion circuit 11 comprising transistors $T_6$ and $T_7$. The feedback signal is coupled through rectifying diode 13 and limiting resistance $R_{19}$ to the base of a first transistor $T_6$ used to amplify the rectified signal voltage: the transistor $T_6$ being biased on when the output voltage is maintained above the prescribed expansion threshold level. A capacitor $C_{12}$ is connected in shunt with the base-emitter circuit of the transistor $T_6$ to provide the proper recovery time, i.e., the transit from a normal signal level to a lower value. The recovery time constant of this circuit may be several seconds in order to accommodate the usual duration of pauses in speech, and is of the same order as, or preferably, the same value as the time constant in recovery of the compression circuit.

The capacitor $C_{12}$ and resistance $R_{19}$ do not perceptably affect the attack time of the expansion circuit. Thus the expansion circuit has a fast attack time, operating fast enough to escape detection by the listener.

A zener diode 32 is also connected in the base-emitter circuit of the transistor $T_6$, the zener diode serving to limit the voltage applied to the base of transistor $T_6$ to prevent overloading of the transistor $T_6$ in normal operating ranges. Its level may be a few volts, preferably slightly above 3 volts. A resistance $R_{20}$ is connected between the emitter of transistor $T_6$ and a suitable supply of negative DC potential connected to terminal **22*a***.

The collector of the transistor $T_6$ is connected to the base of a transistor $T_7$ to turn off transistor $T_7$ when $T_6$ becomes conductive. A noise reduction control potentiometer $R_{21}$ and resistance $R_{22}$ are serially connected between the base of the transistor $T_7$ and ground to apply a positive signal to the base of the transistor $T_7$ to cause conduction thereof in the absence of a signal. The collector of the transistor $T_7$ is connected through a second pair of contacts 33 of the double pole single throw switch 31 to light source 15. The transistor $T_7$, when conducting, serves to energize light source 15. A resistance $R_{23}$ is connected in the emitter circuit of the transistor $T_7$ to control the operating point of the transistor. Light from the light source 15 impinges upon the light dependent resistance 17, which is connected in shunt with the interstage gain control $R_{18}$ to control the amplifier gain.

The operation of the circuit of FIGURE 3 is such that when the switches 27 and 31 are closed the output of the amplifier appearing across terminals 8 will be maintained in accordance with the characteristic shown in FIGURE 2. The precise threshold of compression desired is selected by varying the potentiometer 28. The precise threshold of expansion desired is achieved by the selection of $R_{19}$ and the conductance of diode 13. Noise reduction potentiometer $R_{21}$ determines the amount of gain expansion and viewing FIGURE 2, the magnitude of the step in output level between 21 and 10. Its direct effect is to lower the point of transition between 21 and 20, as indicated by the dashed line 23. The interstage gain control $R_{18}$ can be varied to adjust the gain of the amplifier when the compression and expansion circuits are disabled.

When the output voltage at terminals 8 rises above the prescribed threshold of compression, the signal fed back from tertiary winding 9, and half-wave rectified by diode 12 causes the base of the transistor $T_4$ to become positive thereby overcoming the negative bias which normally maintains this transistor in the off condition and causing the transistor to conduct. When the transistor $T_4$ coducts, the base of the transistor $T_5$ becomes more positive since it is coupled to the emitter of the transistor $T_4$. The transistor $T_5$ thus conducts and energizes the light source 14, the amount of current flowing through the light source 14 being proportional to the peak amplitude of the rectified signal voltage as applied to the base of transistor $T_4$. Thus, light is emitted having an intensity directly proportional to the amplitude of the feedback signal, the value of light dependent resistance 16 being varied in inverse proportion to the amplitude of the feedback signal. Since light dependent resistance 16 is connected between the junction between capacitors $C_3$ and $C_4$ and ground, as this resistance decreases with an increase in intensity of light from light source 14, a larger portion of the signal coupled to the base of $T_3$ is shunted to ground, thereby decreasing the gain of the amplifier. The light dependent resistance 16 although controlling gain in this manner will not affect the bias of the transistors of the amplifier stages since it is isolated by the capacitors $C_3$ and $C_4$.

The feedback signal from the tertiary winding 9 is also rectified by the diode 13 and applied to the base of the transistor $T_6$ as a positive signal, the transistor $T_6$ being conductive when a signal is present because of the positive signal applied to its base. Since the base of the transistor $T_7$ is connected to the collector of transistor $T_6$, the base of transistor $T_7$ is maintained at a negative level when the transistor $T_6$ is conducting, thereby rendering the transistor $T_7$ nonconductive. When the rectified feedback signal at the base of the transistor $T_6$ falls below the prescribed threshold of expansion, the transistor $T_6$ becomes nonconductive. When transistor $T_6$ ceases to conduct, the voltage at the base of transistor $T_7$ which is applied through potentiometer $R_{21}$ and resistance $R_{22}$ becomes positive, thereby causing transistor $T_7$ to conduct. The conduction of transistor $T_7$ causes light source 15 to be energized, thus lowering the resistance of the light dependent resistance 17 and shunting a greater portion of the signal applied to the base of transistor $T_3$ to ground. The gain is lowered without changing the bias of the transistors in the amplifier 4, thus, the noise present at the output terminals 8 is decreased.

The recovery rates of the respective expansion and the compression circuits are made of approximately the same value so as to minimize the change in background noise level during pauses in the program material. In the compression circuit, assuming a signal falling from the compression region, the capacitors $C_{11}$ and $C_{10}$ will have charged and the diode 12 will immediately inhibit discharge through the input branch of the circuit. Capacitor $C_{11}$, the larger of the two capacitors in this circuit, has the principal effect on the recovery rate and it discharges through fixed resistance $R_{14}$, and the active resistance furnished by the transistors $T_4$ and $T_5$ and their associated circuitry. Transistors of higher $\beta$ tend to increase the time constant of the circuit, and in practice it may be necessary to select transistors for a desired $\beta$, since the specifications are currently highly variable for a given type. The selection may be made so that the discharge rate corresponds to a time constant of typically one second. The time constant will preferably lie between ½ second and either 5 or 6 seconds. Since the starting point of the compression circuit is a variable, the total time for discharge will vary with signal level, but the rate of discharge is logarithmically constant.

In the expansion circuit, assuming a signal falling past the expansion threshold, the capacitor $C_{12}$ will have charged, and the diode 13 will immediately inhibit discharge through the input branch of the circuit. Capacitor $C_{12}$ being the only capacitor in the circuit then commences to discharge through the active resistance furnished by the transistors $T_6$ and $T_7$ and their associated circuitry. The presence of the zener diode 32 tends to stabilize the point to which the capacitor $C_{12}$ charges. As in the compression circuit, transistors of higher $\beta$ tend to increase the time constant of the circuit and in practice it may be necessary to select transistors for a desired $\beta$ to achieve the prerequisite time constant. The selection here should be made so that the discharge rate of the capacitor $C_{12}$ in the expansion circuit corresponds to a time constant approximately equal to that selected for the compression circuitry, and may have a typical value of one second.

It will be seen that regardless of the degree to which the compression circuit has been charged that the logarithmic nature of the discharges of the respective circuits is such that the net effect of the two A.G.C. actions will be to keep the noise level substantially constant during short pauses in program material. Thus the selection of correct recovery times in the A.G.C. circuits stabilizes the noise level during pauses in the signal and enables the amplifier to return to its static no-signal low-noise condition.

Although by necessity specific circuit parameters will vary in accordance with individual requirements, the following circuit values have been found to be completely satisfactory in one successful embodiment of the invention.

| Resistances: | Ohms |
|---|---|
| $R_1$ | 27,000 |
| $R_2$ | 2,000 |
| $R_3$ | 4,300 |
| $R_4$ | 24,000 |
| $R_5$ | 10,000 |
| $R_6$ | 1,200 |
| $R_7$ | 2,200 |
| $R_8$ | 560,000 |
| $R_9$ | 180,000 |
| $R_{10}$ | 1,600 |
| $R_{11}$ | 330 |
| $R_{12}$ | 7,500 |
| $R_{13}$ | 25,000 |
| $R_{14}$ | 5,100 |
| $R_{15}$ | 2,000 |
| $R_{16}$ | 11,000 |
| $R_{17}$ | 200 |
| $R_{18}$ | 500,000 |
| $R_{19}$ | 20,000 |
| $R_{20}$ | 1,000 |
| $R_{21}$ | 250,000 |
| $R_{22}$ | 100,000 |
| $R_{23}$ | 200 |
| Capacitances: | Mf. |
| $C_1$ | 20 |
| $C_2$ | 50 |
| $C_3$ | 10 |
| $C_4$ | 10 |
| $C_7$ | 50 |
| $C_8$ | 6800 |
| $C_9$ | 10 |
| $C_{10}$ | 0.1 |
| $C_{11}$ | 35 |
| $C_{12}$ | 35 |

The light sources 14 and 15 may be identical, having a rapid lighting time, and a rapid (though less so) cooling time; a composite quality often referred to as low light inertia. Such a lamp is the GE type 344. This quality may be roughly measured by the amount of time required for a predetermined volume change seen as a power input to the lamp to cause a suitable compensating reaction in brightness. For instance, a 10 db change in volume in the usual case will be compensated in approximately 20 milliseconds by the light.

The photoconductors 16 and 17 may be identical and are typically of CdSe responding preferably in the infrared region to enhance the attack time, since the first output of the lamp in the warm up cycle is within that spectral region. One should also insure tight optical coupling between the lamp and the photoconductor. A suitable photoconductor should have a large resistance variation range, preferably varying from several megohms in a dark condition to several tens of ohms in the fully illuminated condition. Its response time and delay time in the usual case need only be better than that of the associated light source.

The circuit has illustrated the photoconductors connected in shunt, a mode of connection which takes advantage of the extremely high dark resistances of these devices and which configuration is preferable for this reason. The circuit may be used in connection with either vacuum tube or semiconductor amplifiers.

Although the invention has been described with respect to certain specific embodiments, it will be appreciated that modifications and changes may be made by those skilled in the art without departing from the spirit of the invention.

What is claimed as new and desired to be secured by Letters Patent of the United States is:

1. Automatic gain controlled amplifying apparatus comprising:

(a) an amplifier having an electrically controllable gain adjusting element for adjusting the overall gain thereof;

(b) a volume compression circuit responsive to signals appearing at the output of said amplifier for applying a control voltage to said gain adjusting element to reduce the overall gain of said amplifier when a predetermined compression threshold level of said output signals is exceeded, said compression circuit having a predetermined rate of recovery upon reduction in level of said output signals below said compression threshold level;

(c) a volume reduction circuit responsive to said output signals for developing another control voltage across a capacitor, means connected to said capacitor for limiting the maximum unidirectional voltage across said capacitor, a discharge circuit connected across said capacitor for providing a rate of decay of said other control voltage when said output signals applied thereto drop below another threshold level, said other threshold level being lower than said compression level;

(d) means for actuating said gain adjusting element to reduce the overall gain of said amplifier in response to a decay in said other control voltage to a predetermined value, the circuit elements of said volume reduction circuit being proportioned to provide a rate of decay of said other control voltage approximately equal to the rate of recovery of said compression circuit.

2. Apparatus as set forth in claim 1 wherein said rate of recovery and said rate of decay each correspond to a time constant lying in the range of one-half second to six seconds.

3. Apparatus as set forth in claim 1 wherein said volume compression and volume reduction circuits have attack times upon increase in output signal levels sufficiently rapid to be apparently instantaneous.

4. Apparatus as set forth in claim 1 wherein said volume reduction circuit produces a substantial step type reduction in gain.

5. Automatic gain controlled amplifying apparatus comprising:

(a) an amplifier having a pair of electrically controllable gain adjusting elements each including a photosensitive resistor connected in shunt with a signal path of said amplifier and each having optically coupled thereto a light source;

(b) a volume compression circuit responsive to signals appearing at the output of said amplifier for developing a first control voltage in accordance with the level of output of said amplifier when a compression threshold level of said output signals is exceeded, means for applying said first control voltage to one of said light sources to reduce the overall gain of said amplifier, said compression circuit having a predetermined rate of recovery upon reduction in level of said output signals below said compression threshold level;

(c) a volume reduction circuit responsive to signals appearing at the output of said amplifier for developing a second control voltage across a capacitor, means connected to said capacitor for limiting the maximum unidirectional voltage across said capacitor, a discharge circuit connected across said capacitor for providing a rate of decay of said second control voltage when said output signals applied thereto drop below another threshold level, said other threshold being lower than said compression threshold level;

(d) means for actuating the other of said light sources to reduce the overall gain of said amplifier in response to a decay in said second control voltage to a predetermined value, the circuit elements of said volume reduction circuit being proportioned to provide a rate of decay of said second control voltage approximately equal to the rate of recovery of said compression circuit.

6. Apparatus as set forth in claim 5 wherein said amplifier is a plural stage transistor amplifier and wherein said photosensitive resistors are located between said stages with DC isolation.

References Cited

UNITED STATES PATENTS

| | | | |
|---|---|---|---|
| 2,673,899 | 3/1954 | Montgomery | 330—141 |
| 2,760,008 | 8/1956 | Schade | 330—141 X |
| 3,213,391 | 10/1965 | Kovalevski et al. | |

ROY LAKE, *Primary Examiner.*

NATHAN KAUFMAN, *Assistant Examiner.*